United States Patent
Ono et al.

(10) Patent No.: US 11,804,868 B2
(45) Date of Patent: Oct. 31, 2023

(54) RADIO FREQUENCY CIRCUIT AND COMMUNICATION DEVICE

(71) Applicant: Murata Manufacturing Co., Ltd., Kyoto (JP)

(72) Inventors: Atsushi Ono, Nagaokakyo (JP); Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 274 days.

(21) Appl. No.: 17/205,486

(22) Filed: Mar. 18, 2021

(65) Prior Publication Data
US 2021/0297109 A1    Sep. 23, 2021

(30) Foreign Application Priority Data
Mar. 23, 2020  (JP) ................................ 2020-051414

(51) Int. Cl.
| | |
|---|---|
| H04B 1/40 | (2015.01) |
| H03F 3/24 | (2006.01) |
| H04B 1/04 | (2006.01) |
| H01B 1/04 | (2006.01) |
| H03F 1/02 | (2006.01) |
| H04B 1/00 | (2006.01) |
| H03F 1/56 | (2006.01) |

(52) U.S. Cl.
CPC .............. *H04B 1/40* (2013.01); *H03F 3/245* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 10,090,868 B2* | 10/2018 | Kondo | ...................... | H03F 1/56 |
| 10,257,119 B2 | 4/2019 | Wloczysiak et al. | | |
| 10,868,577 B2* | 12/2020 | Thompson | ............. | H04B 1/005 |
| 11,245,385 B2* | 2/2022 | Oshita | .................... | H03H 9/725 |
| 2014/0112213 A1* | 4/2014 | Norholm | .................. | H04B 1/56 |
| | | | | 370/277 |
| 2016/0080012 A1* | 3/2016 | Sun | ........................... | H03F 3/24 |
| | | | | 455/114.2 |
| 2016/0276983 A1 | 9/2016 | Vaillancourt et al. | | |
| 2018/0076834 A1* | 3/2018 | Wloczysiak | ......... | H04M 11/062 |
| 2019/0013790 A1* | 1/2019 | Ayranci | ................ | H04B 1/006 |

(Continued)

FOREIGN PATENT DOCUMENTS

| | | |
|---|---|---|
| JP | 2019-083476 A | 5/2019 |
| WO | 2019/167416 A1 | 9/2019 |

*Primary Examiner* — Pablo N Tran
(74) *Attorney, Agent, or Firm* — Pearne & Gordon LLP

(57) ABSTRACT

A radio frequency circuit includes: a plurality of input terminals including a first input terminal through which a first Wireless Local Area Network (WLAN) transmission signal is received and a second input terminal through which a 5th Generation New Radio (5G NR) transmission signal is received; a power amplifier; a first switch connected to an input side of the power amplifier and switches a connection of the power amplifier between the plurality of input terminals; and a variable phase circuit connected to an output side of the power amplifier and changes the impedance matching between the power amplifier and the load in accordance with a connection status of the first switch.

21 Claims, 13 Drawing Sheets

(56) References Cited

U.S. PATENT DOCUMENTS

2019/0068127 A1* 2/2019 Ishikawa ................ H03F 3/195
2019/0131941 A1 5/2019 Ishihara et al.
2020/0403646 A1 12/2020 Takada

* cited by examiner

RADIO FREQUENCY CIRCUIT AND COMMUNICATION DEVICE

CROSS REFERENCE TO RELATED APPLICATION

The present application is based on and claims priority of Japanese Patent Application No. 2020-051414 filed on Mar. 23, 2020. The entire disclosure of the above-identified application, including the specification, drawings and claims is incorporated herein by reference in its entirety.

TECHNICAL FIELD

The present disclosure relates to radio frequency circuits and communication devices.

BACKGROUND

Frequency bands that are usable without radio station licenses (hereinafter referred to as unlicensed bands) are finding their applications in mobile communications systems for mobile phones, etc. For example, the 3rd Generation Partnership Project (3G PP) has standardized, in Release 13, Licensed-Assisted Access (LAA). LAA is a technology for utilizing a 5 GHz unlicensed band used in a Wireless Local Area Network (WLAN) as a Long-Term Evolution (LTE) carrier dedicated to downlink transmission.

In LAA, an unlicensed band is used for Carrier Aggregation (CA) together with a frequency band that requires a radio station license (hereinafter referred to as a licensed band). U.S. patent Ser. No. 10/257,119 discloses a front-end module that enables the shared use of a low-noise amplifier between LAA and WLAN as described above.

BRIEF SUMMARY

The 5th Generation New Radio (5G NR) has studied the use of 5 GHz unlicensed bands for uplink transmission. However, as recognized by the present inventor, the difference in the requirements specifications for a power amplifier is greater than that of a low-noise amplifier. It is thus difficult to apply the technology, disclosed in U.S. Pat. No. 10,257,119, of sharing a low-noise amplifier directly to the power amplifier.

In view of the above, the present disclosure provides radio frequency circuits and communication devices that enable the shared use of a power amplifier between 5G NR and WLAN.

The radio frequency circuit according to an aspect of the present disclosure includes: a plurality of input terminals including a first input terminal through which a first WLAN transmission signal is received and a second input terminal through which a 5GNR transmission signal is received; a power amplifier; a first switch connected to an input side of the power amplifier and switches a connection of the power amplifier between the plurality of input terminals; and a variable phase circuit connected to an output side of the power amplifier and changes the impedance matching between the power amplifier and a load in accordance with a connection status of the first switch.

The present disclosure enables the shared use of a power amplifier between 5G NR and WLAN.

BRIEF DESCRIPTION OF DRAWINGS

These and other advantages and features will become apparent from the following description thereof taken in conjunction with the accompanying Drawings, by way of non-limiting examples of embodiments disclosed herein.

DETAILED DESCRIPTION OF EMBODIMENTS

Figure 1:
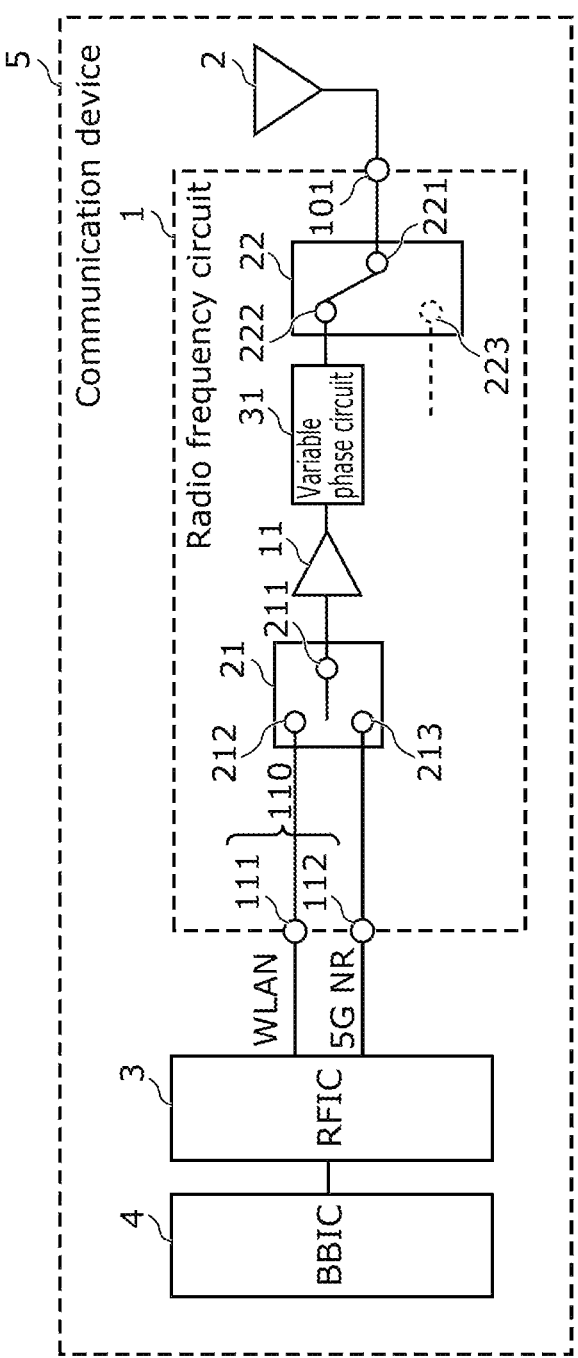
FIG. 1 is a diagram showing the circuit configurations of a radio frequency circuit and a communication device according to Embodiment 1.

The following describes in detail the embodiments according to the present disclosure with reference to the drawings. Note that the following embodiments show a comprehensive or specific example of the present disclosure. The numerical values, shapes, materials, structural elements, the arrangement and connection of the structural elements, etc. shown in the following embodiments are mere examples, and thus are not intended to limit the present disclosure.

Note that the drawings are schematic diagrams in which emphasis, omission, or ratio adjustment has been applied where necessary to illustrate the present disclosure. The drawings are thus not necessarily exact illustration of the present disclosure, and may illustrate shapes, positional relationships, and ratios differently from the actual ones. In the drawings, substantially the same structural elements are assigned the same reference marks, and their repetitive description may be omitted or simplified.

In the radio frequency circuit according to an aspect of the present disclosure, "directly connected" means that elements are directly connected by a connection terminal and/or a wiring conductor without being connected via another circuit element. Meanwhile, "connected" means not only the case where elements are directly connected by a connection terminal and/or a wiring conductor, but also the case where elements are electrically connected via another circuit element. Also, "connected between A and B" means that an element is connected to both A and B in between A and B.

Embodiment 1

1.1 Circuit Configurations of Radio Frequency Circuit 1 and Communication Device 5

With reference to FIG. 1, the following describes the circuit configurations of radio frequency circuit 1 and communication device 5 according to the present embodiment. FIG. 1 is a diagram showing the circuit configurations of radio frequency circuit 1 and communication device 5 according to Embodiment 1.

1.1.1 Circuit Configuration of Communication Device 5

The circuit configuration of communication device 5 will be described first. As shown in FIG. 1, communication device 5 according to the present embodiment includes radio frequency circuit 1, antenna 2, RFIC 3, and BBIC 4.

Radio frequency circuit 1 transfers a radio frequency signal between antenna 2 and RFIC 3. A detailed circuit configuration of radio frequency circuit 1 will be described later.

Antenna 2 is connected to antenna connection terminal 101 of radio frequency circuit 1, and transmits radio frequency signals outputted from radio frequency circuit 1.

RFIC 3 is an exemplary signal processing circuit that processes a radio frequency signal. More specifically, RFIC 3 performs signal processing, such as up-conversion, on transmission signals inputted from BBIC 4, and outputs the resulting radio frequency transmission signal to radio frequency circuit 1. RFIC 3 includes a controller that controls switches, an amplifier, and so forth included in radio frequency circuit 1. The function of RFIC 3 as a controller may be implemented outside of RFIC 3, and thus may be implemented, for example, in BBIC 4.

BBIC 4 is a baseband signal processing circuit that performs a signal processing by use of an intermediate frequency band, the frequency of which is lower than that of radio frequency signals transferred by radio frequency circuit 1. Used as signals processed by BBIC 4 is, for example, an image signal for image display, and/or as a sound signal for telephone conversation through a speaker.

Note that antenna 2 and BBIC 4 are not essential structural elements of communication device 5 according to the present embodiment.

1.1.2 Circuit Configuration of Radio Frequency Circuit 1

Next, the circuit configuration of radio frequency circuit 1 will be described. As shown in FIG. 1, radio frequency circuit 1 includes power amplifier 11, switches 21 and 22, variable phase circuit 31, antenna connection terminal 101, and a plurality of input terminals 110 that include first input terminal 111 and second input terminal 112.

First input terminal 111 is a terminal through which a WLAN transmission signal is received from RFIC 3. The WLAN transmission signal is a signal transmitted by a client to an access point in compliance with the Institute of Electrical and Electronics Engineers (IEEE) 802.11 standard. Examples of a WLAN frequency band used in the present embodiment include: 5.15-5.35 GHz, 5.47-5.85 GHz, and 5.925-7.125 GHz.

Second input terminal 112 is a terminal through which a 5GNR transmission signal is received from RFIC 3. The 5GNR transmission signal is an uplink signal transmitted by a terminal device to a base station in compliance with 5G NR, which is a radio access technology (RAT) for the 5th Generation mobile communications system developed by 3G PP. Examples of a 5GNR frequency band used in the present embodiment include: n46 (5.15-5.925 GHz) and n96 (5.925-7.125 GHz).

Note that a plurality of input terminals 110 may include another input terminal different from first input terminal 111 and second input terminal 112. In this case, such another input terminal may be a terminal through which a transmission signal of another communication system (e.g., the 6th Generation mobile communications system) is received.

Power amplifier 11 is an amplifier capable of amplifying the WLAN transmission signal and the 5GNR transmission signal. Power amplifier 11 is not limited to having a particular configuration. For example, power amplifier 11 may be implemented as a plurality of cascaded amplifiers and/or a differential amplifier.

Switch 21, which is an example of the first switch, is connected to the input side of power amplifier 11. Switch 21 switches a connection of power amplifier 11 between a plurality of input terminals 110. Switch 21 according to the present embodiment switches between connecting power amplifier 11 and first input terminal 111, and connecting power amplifier 11 and second input terminal 112. More specifically, switch 21 includes common terminal 211 connected to power amplifier 11, first terminal 212 connected to first input terminal 111, and second terminal 213 connected to second input terminal 112. Having such connection structure, switch 21 connects one of first terminal 212 and second terminal 213 to common terminal 211 on the basis of a control signal, for example, from RFIC 3. This enables switch 21 to switch between connecting power amplifier 11 and first input terminal 111, and connecting power amplifier 11 and second input terminal 112. Switch 21 is implemented, for example, as a single pole double throw (SPDT) switch circuit.

Switch 22, which is an exemplary antenna switch, switches between connecting and disconnecting power amplifier 11 and antenna connection terminal 101. More specifically, switch 22 includes common terminal 221 connected to antenna connection terminal 101, first terminal 222 connected to power amplifier 11 via variable phase circuit 31, and optional second terminal 223. Second terminal 223 is used, for example, for a reception path, a bypass path connected to another radio frequency circuit, a transmission path for a licensed band, and so forth, but the present disclosure is not limited to these usages. Note that switch 22 may not include second terminal 223. Having such connection structure, switch 22 connects one of, or both of first terminal 222 and second terminal 223 to common terminal 221 on the basis of a control signal, for example, from RFIC 3. This enables switch 22 to switch between connecting and disconnecting power amplifier 11 and antenna connection terminal 101. Switch 22 is implemented, for example, as a multi-connection switch circuit capable of two or more simultaneous connections.

Variable phase circuit 31, which is connected to the output side of power amplifier 11, changes the impedance matching between power amplifier 11 and the load in accordance with a connection status of switch 21. Through this, variable phase circuit 31 changes the properties of power amplifier 11.

Under a condition that switch 21 connects first input terminal 111 to power amplifier 11, for example, the phase of variable phase circuit 31 is set to a first phase. Through this, the impedance matching is changed between power amplifier 11 and the load to provide power amplifier 11 with the properties appropriate for the amplification of a WLAN transmission signal. More specifically, this provides power amplifier 11 with the amplification properties of giving a higher priority to the linearity than to the gain in the amplification of WLAN transmission signals.

Also, under a condition that switch 21 connects second input terminal 112 to power amplifier 11, for example, the phase of variable phase circuit 31 is set to a second phase, which is different from the first phase. Through this, the impedance matching is changed between power amplifier 11 and the load to provide power amplifier 11 with the properties appropriate for the amplification of 5GNR transmission signals. More specifically, this provides power amplifier 11 with the amplification properties of giving a higher priority to the gain than to the linearity in the amplification of 5GNR transmission signals.

Figure 2:
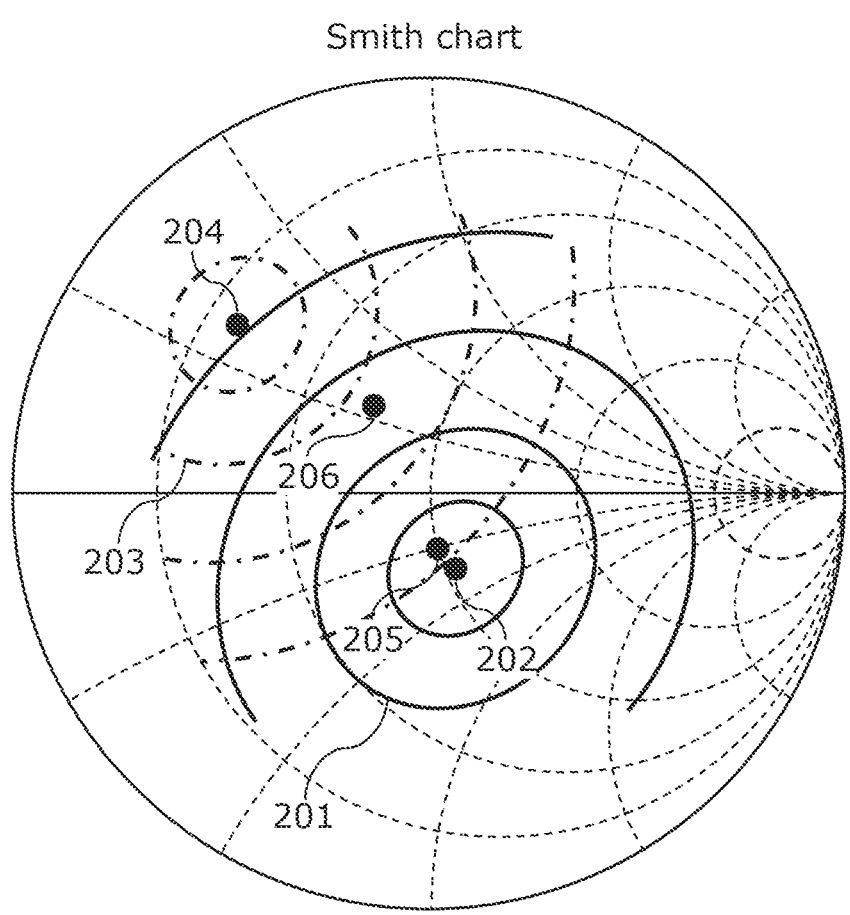
FIG. 2 is a smith chart showing the relationship between the output impedance of a power amplifier and the linearity and gain characteristics of the power amplifier.

With reference to FIG. 2, the following describes the first phase and the second phase. FIG. 2 is a smith chart showing the relationship between the output impedance of power amplifier 11 and the linearity and gain characteristics of power amplifier 11. In FIG. 2, the output impedance of power amplifier 11 refers to the impedance of power amplifier 11 seen from first terminal 222 in a state in which common terminal 221 and first terminal 222 of switch 22 shown in FIG. 1 are connected.

Error Vector Magnitude (EVM) distribution 201 represented by the solid lines indicate the EVM distribution with respect to the output impedance of power amplifier 11. In EVM distribution 201, an EVM is smaller as it is closer to the center. Minimum EVM point 202 indicates the output impedance of power amplifier 11 at which the EVM is the smallest. Also, power distribution 203 represented by the dash-dot-dash lines indicate the output power distribution of power amplifier 11 with respect to the output impedance of power amplifier 11. In power distribution 203, output power is greater as it is closer to the center. Maximum power point 204 indicates the output impedance of power amplifier 11 at which the output power of power amplifier 11 is the greatest.

First matching point 205 indicates the output impedance of power amplifier 11 corresponding to the first phase. Stated differently, variable phase circuit 31 is set to the first phase under a condition that common terminal 211 is connected to first terminal 212 in switch 21, thereby setting the output impedance of power amplifier 11 to first matching point 205.

Meanwhile, second matching point 206 indicates the output impedance of power amplifier 11 corresponding to the second phase. Stated differently, variable phase circuit 31 is set to the second phase under a condition that common terminal 211 is connected to second terminal 213 in switch 21, thereby setting the output impedance of power amplifier 11 to second matching point 206.

As is clear from FIG. 2, at first matching point 205, the output power is lower but the EVM is better (decreases) than at second matching point 206. Stated differently, with the output impedance at first matching point 205, power amplifier 11 is able to obtain the amplification properties of giving a higher priority to the linearity than to the gain.

Meanwhile, at second matching point 206, the EVM is lower (increases) but the output power is greater than at first matching point 205. Stated differently, with the output impedance at second matching point 206, power amplifier 11 is able to obtain the amplification properties of giving a higher priority to the gain than to the linearity.

Note that switch 22 is not an essential structural element of radio frequency circuit 1 according to the present embodiment.

1.1.3 Circuit Configuration of Variable Phase Circuit 31

Figure 3:
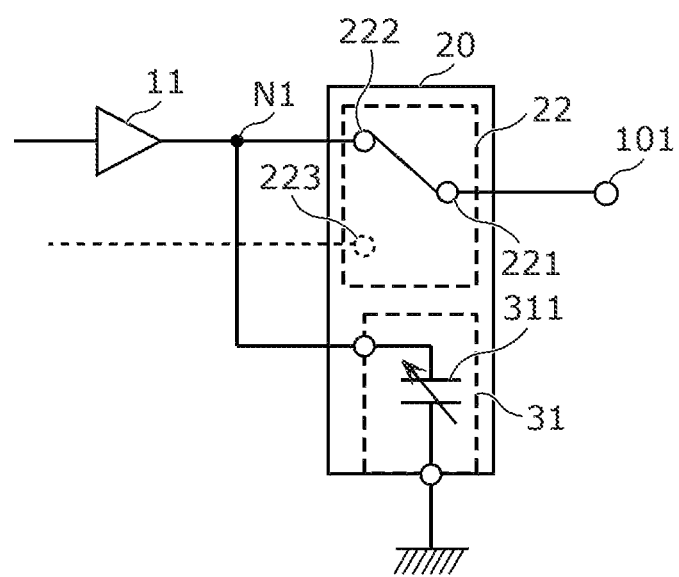
FIG. 3 is a circuit diagram showing the periphery of a variable phase circuit according to Embodiment 1.

With reference to FIG. 3, the following specifically describes a concrete example of the circuit configuration of variable phase circuit 31. FIG. 3 is a circuit diagram showing the periphery of variable phase circuit 31 according to Embodiment 1.

Variable phase circuit 31 includes variable capacitor 311. Non-limiting examples of variable capacitor 311 include a digitally tunable capacitor (DTC).

As shown in FIG. 3, variable capacitor 311 is connected between the ground and node N1 located at the output side of power amplifier 11. Stated differently, variable capacitor 311 is a parallel element connected between the ground and a path that couples power amplifier 11 and antenna connection terminal 101. Variable capacitor 311 in this case serves as a shunt capacitor.

Variable capacitor 311 and switch 22 are included in the same semiconductor component 20. Semiconductor component 20, which is also referred to as a semiconductor integrated circuit, is an electronic component that includes an electronic circuit on a surface or inside of a semiconductor chip (also referred to as die). Semiconductor component 20 may have, for example, a complementary metal oxide semiconductor (CMOS) structure. More specifically, semiconductor component 20 may be fabricated by a silicon on insulator (SOI) process. This enables a low-cost manufacture of semiconductor component 20. Note that semiconductor component 20 may include at least one of GaAs, SiGe, or GaN. This enables to provide high quality semiconductor component 20.

Note that variable capacitor 311 in an example of FIG. 3 is connected between the ground and node N1, but the present disclosure is not limited to this disposition. For example, variable capacitor 311 may be connected between node N1 and first terminal 222. In this case, variable capacitor 311 is a serial element connected in a path that couples power amplifier 11 and antenna connection terminal 101. Variable capacitor 311 in this case serves as a series capacitor.

Also, variable capacitor 311 in an example shown in FIG. 3 is included in semiconductor component 20, but the present disclosure is not limited to this disposition. Variable capacitor 311 may be included in a component different from that of switch 22.

1.2 Operations of Radio Frequency Circuit 1 and Communication Device 1

Figure 4:
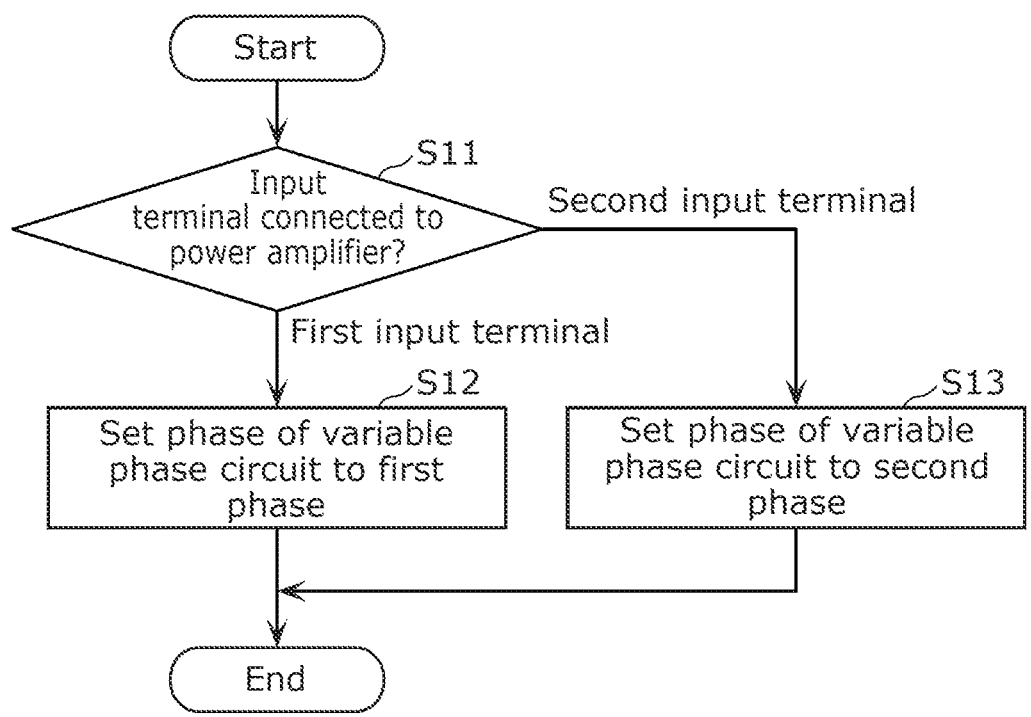
FIG. 4 is a flowchart of operations performed by the radio frequency circuit and the communication device according to Embodiment 1.

With reference to FIG. 4, the following describes the operations performed by radio frequency circuit 1 and communication device 5 with the above configurations. FIG. 4 is a flowchart of the operations performed by radio frequency circuit 1 and communication device 5 according to Embodiment 1.

As shown in FIG. 4, input terminal 110 connected to power amplifier 11 is determined (S11). Stated differently, a connection status of switch 21 is determined.

Here, in the case where first input terminal 111 is connected to power amplifier 11 (first input terminal in S11), the phase of variable phase circuit 31 is set to the first phase (S12). Stated differently, the phase of variable phase circuit 31 is changed to change the impedance matching between power amplifier 11 and the load.

Meanwhile, in the case where second input terminal 112 is connected to power amplifier 11 (second input terminal in S11), the phase of variable phase circuit 31 is set to the second phase, which is different from the first phase (S13). Stated differently, the phase of variable phase circuit 31 is changed to change the impedance matching between power amplifier 11 and the load.

The control of the phases of variable phase circuit 31 shown in FIG. 3 (S11 through S13) is performed by the controller included in RFIC 3. Note that the controller may be implemented outside of RFIC 3, and thus may be implemented in radio frequency circuit 1 or BBIC 4.

As described above, radio frequency circuit 1 according to the present embodiment includes: a plurality of input terminals 110 including first input terminal 111 through which a WLAN transmission signal is received and second input terminal 112 through which a 5GNR transmission signal is received; power amplifier 11; switch 21 connected to an input side of power amplifier 11 and switches a connection of power amplifier 11 between the plurality of input terminals 110; and variable phase circuit 31 connected to an output side of power amplifier 11 and changes the impedance matching between power amplifier 11 and the load in accordance with a connection status of switch 21.

This configuration changes the impedance matching between power amplifier 11 and the load in accordance with a radio frequency transmission signal to be amplified. This configuration is thus capable of adjusting the impedance matching between power amplifier 11 and the load so that power amplifier 11 can obtain the amplification properties appropriate for the amplification of each radio frequency transmission signal. This configuration thus enables a single power amplifier 11 to satisfy the requirement specifications of a plurality of radio frequency transmission signals. As a result, the shared use of power amplifier 11 is enabled between a plurality of radio frequency transmission signals, thus simplifying radio frequency circuit 1.

In particular, a WLAN transmission signal and a 5GNR transmission signal utilizing unlicensed bands of 5 GHz or greater are similar in their requirement specifications to power amplifier 11. However, due to differences in communication distances, modulation methods, and so forth, a WLAN transmission signal requires a higher signal quality than is required by a 5GNR transmission signal and a 5GNR transmission signal requires a higher power level than is required by a WLAN transmission signal. To cope with these differences, the impedance matching is adjusted between power amplifier 11 and the load to provide power amplifier 11 with the amplification properties of giving a higher priority to the linearity than to the gain in the amplification of a WLAN transmission signal, and the impedance matching is adjusted between power amplifier 11 and the load to provide power amplifier 11 with the amplification properties of giving a higher priority to the gain than to the linearity in the amplification of a 5GNR transmission signal. This enables the shared use of power amplifier 11 between WLAN and 5G NR.

Also in radio frequency circuit 1 according to the present embodiment, for example, variable phase circuit 31 may include variable capacitor 311.

This configuration enables an easy implementation of variable phase circuit 31, using, for example, a DTC.

Also, radio frequency circuit 1 according to the present embodiment may further include, for example, switch 22 that switches between connecting and disconnecting power amplifier 11 and antenna connection terminal 101. In this radio frequency circuit 1, variable capacitor 311 and switch 22 may be included in the same semiconductor component 20.

This configuration reduces the number of components to be mounted on the substrate, thereby achieving the downsizing of radio frequency circuit 1.

Also in radio frequency circuit 1 according to the present embodiment, for example, the frequency band of the WLAN transmission signal may be one of 5.15-5.35 GHz, 5.47-5.85 GHz, or 5.925-7.125 GHz, and the frequency band of the 5GNR transmission signal may be one of n46 (5.15-5.925 GHz) or n96 (5.925-7.125 GHz).

This configuration enables radio frequency circuit 1 to transmit the WLAN transmission signal and the 5GNR transmission signal in the above frequency bands.

Also, communication device 5 according to the present embodiment includes: RFIC 3 that processes a radio frequency signal; and radio frequency circuit 1 that transfers the radio frequency signal between RFIC 3 and antenna 2.

This configuration enables communication device 5 to achieve the same effects as those achieved by radio frequency circuit 1.

Variation 1

Next, Variation 1 will be described. The present variation is different from Embodiment 1 mainly in the configuration of the variable phase circuit. With reference to the drawings, the following focuses on the differences from Embodiment 1 to describe the present variation.

Note that radio frequency circuit 1 and communication device 5 according to the present variation are the same as those of Embodiment 1, excluding that switch 22A and variable phase circuit 31A are included, instead of switch 22 and variable phase circuit 31. The illustration and description of the circuit configurations of radio frequency circuit 1 and communication device 5 according to the present variation will not be thus given.

2.1 Circuit Configuration of Variable Phase Circuit 31A

Figure 5:
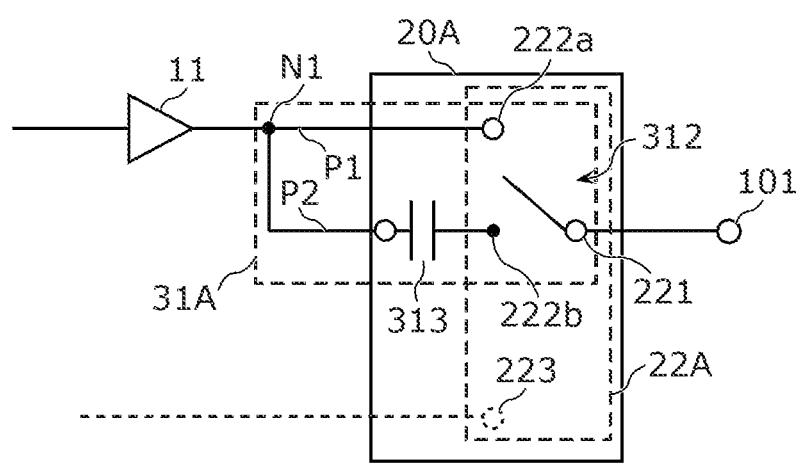
FIG. 5 is a circuit diagram showing the periphery of a variable phase circuit according to Variation 1.

FIG. 5 is a circuit diagram showing the periphery of variable phase circuit 31A according to Variation 1. As shown in FIG. 5, variable phase circuit 31A includes switch 312 and capacitor 313.

Capacitor 313, which is an exemplary reactance element, is connected to one of two paths P1 and P2 (here, capacitor 313 is connected to path P2). Two paths P1 and P2, which are exemplary first path and second path, respectively, are paths coupling power amplifier 11 and antenna connection terminal 101. Capacitor 313, which is a serial element, serves as a series capacitor under a condition that switch 312 connects capacitor 313 to path P2.

Switch 312, which is an exemplary second switch, switches between two paths P1 and P2 in accordance with a connection status of switch 21. More specifically, switch 312 switches between paths P1 and P2 depending on which one of first input terminal 111 and second input terminal 112 switch 21 connects power amplifier 11 to. For example, in the case where switch 21 connects first input terminal 111 to power amplifier 11, switch 312 connects capacitor 313 to path P1, thereby setting the phase of variable phase circuit 31A to the first phase. Meanwhile, in the case where switch 21 connects second input terminal 112 to power amplifier 11, switch 312 connects capacitor 313 to path P2, thereby setting the phase of variable phase circuit 31A to the second phase. In response to switch 312 switching between two paths P1 and P2 in accordance with a connection status of switch 21 in the above manner, variable phase circuit 31A switches between the first phase and the second phase to change the impedance matching between power amplifier 11 and the load.

Note that the relationship between a connection status of switch 21 and a path connected by switch 312 is not limited to the foregoing relationship. For example, switch 312 may connect capacitor 313 to path P2 under a condition that switch 21 connects first input terminal 111 to power amplifier 11.

Switch 22A, which is an exemplary antenna switch, switches between connecting and disconnecting power amplifier 11 and antenna connection terminal 101. Switch 22A according to the present variation further includes switch 312, which is an example of the second switch.

More specifically, switch 22A includes common terminal 221 connected to antenna connection terminal 101, two first terminals 222a and 222b, and optional second terminal 223. First terminal 222a is connected to power amplifier 11 in path P1. First terminal 222b is connected to power amplifier 11 in path P2 via capacitor 313. Having such connection structure, switch 22A connects one of first terminals 222a and 222b, and/or second terminal 223 to common terminal 221 on the basis of a control signal, for example, from RFIC 3. This enables switch 22A to switch between two paths P1 and P2 and switch between connecting and disconnecting power amplifier 11 and antenna connection terminal 101. Switch 22A is implemented, for example, as a multi-connection switch circuit capable of two or more simultaneous connections.

Switch 312 and capacitor 313 are included in the same semiconductor component 20A. Switch 22A is also included in semiconductor component 20A. Semiconductor component 20A may have a CMOS structure, or the like, as with semiconductor component 20 according to Embodiment 1.

2.2 Singhal Flows in Periphery of Variable Phase Circuit 31A

Figure 6A:
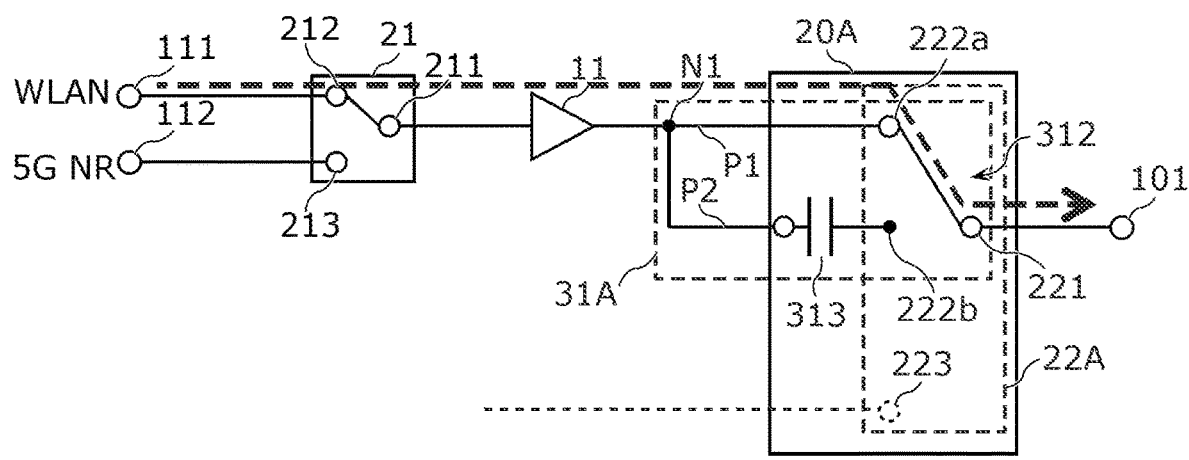
FIG. 6A is a circuit diagram showing a first connection status of the variable phase circuit according to Variation 1.
Figure 6B:
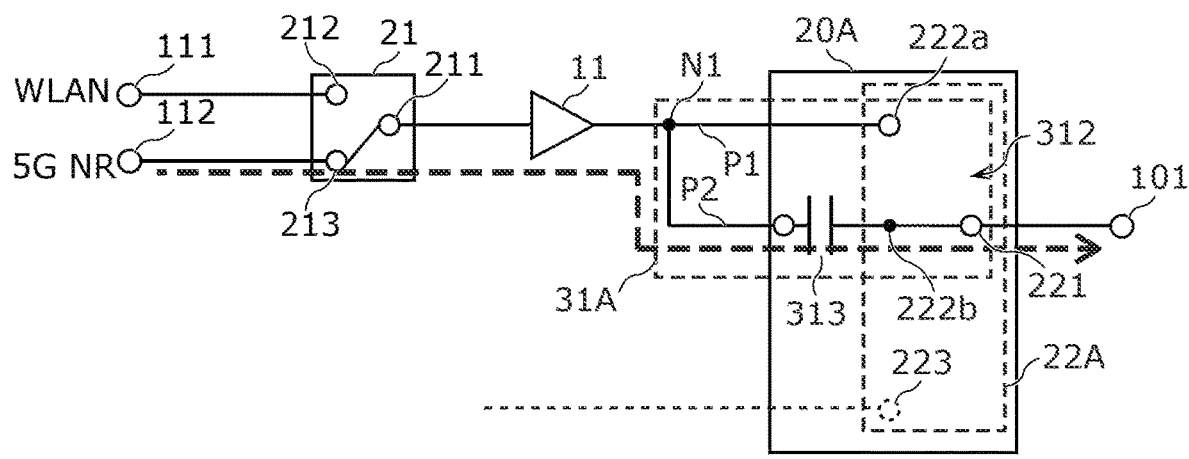
FIG. 6B is a circuit diagram showing a second connection status of the variable phase circuit according to Variation 1.

With reference to FIG. 6A and FIG. 6B, the following describes the signal flows in the periphery of variable phase circuit 31A with the above configuration. FIG. 6A is a circuit diagram showing a first connection status of variable phase circuit 31A according to Variation 1. FIG. 6B is a circuit diagram showing a second connection status of variable phase circuit 31A according to Variation 1. In FIG. 6A and FIG. 6B, the dashed arrows represent the signal flows in the first connection status and the second connection status, respectively.

To enable the first connection status in FIG. 6A and the second connection status in FIG. 6B, the controller of RFIC 3 controls the connections of the switches in radio frequency circuit 1.

More specifically, in FIG. 6A, RFIC 3 causes switch 21 to connect common terminal 211 and first terminal 212, and causes switch 22A (312) to connect common terminal 221 and first terminal 222a. This enables a WLAN transmission signal to be transferred from RFIC 3 to antenna 2 via first input terminal 111, switch 21, power amplifier 11, switch 22A, and antenna connection terminal 101. Here, capacitor 313 is not connected to the transmission path of the WLAN transmission signal, and thus the phase of variable phase circuit 31A is set to the first phase.

Also, in FIG. 6B, RFIC 3 causes switch 21 to connect common terminal 211 and second terminal 213, and causes switch 22A (312) to connect common terminal 221 and second terminal 222b. This enables a 5GNR transmission signal to be transferred from RFIC 3 to antenna 2 via second input terminal 112, switch 21, power amplifier 11, capacitor 313, switch 22A, and antenna connection terminal 101. Here, capacitor 313 is connected to the transmission path of the 5GNR transmission signal, and thus the phase of variable phase circuit 31A is set to the second phase.

In the above manner, in response to the switching between path P1, to which capacitor 313 is not connected, and P2, to which capacitor 313 is connected, in accordance with a connection status of switch 21, variable phase circuit 31A switches between the first phase and the second phase to change the impedance matching between power amplifier 11 and the load.

As described above, in radio frequency circuit 1 according to the present variation, variable phase circuit 31A may include: switch 312 that switches between path P1 coupling power amplifier 11 and antenna connection terminal 101 and path P2 coupling power amplifier 11 and antenna connection terminal 101 in accordance with a connection status of switch 21; and a reactance element connected to path P2 and not connected to path P1.

This configuration enables an easy implementation of variable phase circuit 31A, using switch 312 and an invariable reactance element as a serial element.

Also, for example, switch 312 may select path P1 under a condition that switch 21 connects first input terminal 111 and power amplifier 11, and select path P2 under a condition that switch 21 connects second input terminal 112 and power amplifier 11.

In this configuration, the reactance element (capacitor 313) of variable phase circuit 31A is not connected to the transmission path for the transmission of a WLAN transmission signal, which requires a higher signal quality than is required by a 5GNR transmission signal. This configuration is thus capable of reducing the loss caused by the reactance element, thereby reducing the degradation in signal quality caused by variable phase circuit 31A.

Also, in radio frequency circuit 1 according to the present variation, the reactance element may include capacitor 313, and capacitor 313 and switch 312 may be included in the same semiconductor component 20A.

This configuration reduces the number of components to be mounted on the substrate, thereby achieving the downsizing of radio frequency circuit 1.

Note that variable phase circuit 31A according to the present variation includes capacitor 313 as a reactance element, but the present disclosure is not limited to this configuration. Variable phase circuit 31A may thus include an inductor instead of, or in addition to capacitor 313.

Also, the capacitor is not connected to path P1 in the present variation, but the present disclosure is not limited to this. For example, another capacitor having a capacitance different from that of capacitor 313 may be connected to path P1.

Also, capacitor 313 according to the present variation is included in semiconductor component 20A together with switch 312, but the present disclosure is not limited to this. For example, capacitor 313 may be included in a component different from that of switch 312.

Also, switch 312 of variable phase circuit 31A according to the present variation is included in switch 22A implemented as an antenna switch, but the present disclosure is not limited to this. For example, switch 312 may be included in a component different from that of switch 22A and connected in series to switch 22A.

Also, capacitor 313 may be a variable capacitor.

Variation 2

Next, Variation 2 will be described. The present variation is different from Embodiment 1 mainly in the configuration of the variable phase circuit. With reference to the drawings, the following focuses on the difference from Embodiment 1 to describe the present variation.

Note that radio frequency circuit 1 and communication device 5 according to the present variation are the same as those of Embodiment 1, excluding that variable phase circuit 31B is included instead of variable phase circuit 31. The illustration and description of the circuit configurations of radio frequency circuit 1 and communication device 5 according to the present variation will not be thus given.

3.1 Circuit Configuration of Variable Phase Circuit 31B

Figure 7:
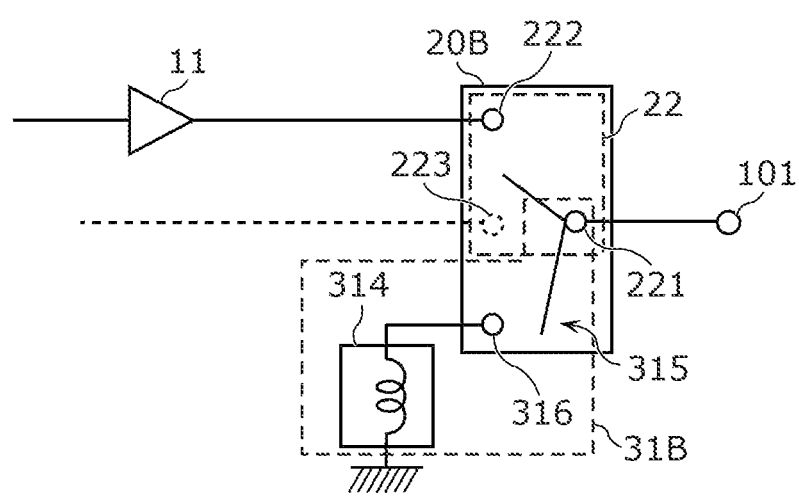
FIG. 7 is a circuit diagram showing the periphery of a variable phase circuit according to Variation 2.

FIG. 7 is a circuit diagram showing the periphery of variable phase circuit 31B according to Variation 2. As shown in FIG. 7, variable phase circuit 31B includes inductor 314 and switch 315.

Inductor 314, which is an example of the reactance element, is connected between the ground and a node (common terminal 221) located at the output side of power amplifier 11. Inductor 314, which is a parallel element connected between the ground and a path that couples power amplifier 11 and antenna connection terminal 101, serves as a shunt inductor.

Switch 315, which is an exemplary third switch, switches between connecting and disconnecting inductor 314 and power amplifier 11 in accordance with a connection status of switch 21. More specifically, switch 315 switches between connecting and disconnecting inductor 314 and power amplifier 11 depending on which one of first input terminal 111 and second input terminal 112 switch 21 connects power amplifier 11 to. For example, in the case where switch 21 connects first input terminal 111 to power amplifier 11, switch 315 does not connect inductor 314 to power amplifier 11, thereby setting the phase of variable phase circuit 31B to the first phase. Meanwhile, in the case where switch 21 connects second input terminal 112 to power amplifier 11, switch 315 connects inductor 314 to power amplifier 11, thereby setting the phase of variable phase circuit 31B to the second phase. In response to switch 315 switching between connecting and disconnecting inductor 314 and power amplifier 11 in accordance with a connection status of switch 21 in the above manner, variable phase circuit 31B switches between the first phase and the second phase to change the impedance matching between power amplifier 11 and the load.

More specifically, switch 315 includes common terminal 221 connected to antenna connection terminal 101 and third terminal 316 connected to inductor 314. Having such connection structure, switch 315 switches between connecting and disconnecting common terminal 221 and third terminal 316 on the basis of a control signal, for example, from RFIC 3. This enables switch 315 to switch between connecting and disconnecting inductor 314 and power amplifier 11. Switch 315 is implemented, for example, as a single pole single throw (SPST) switch circuit.

Switch 315 and switch 22 are included in the same semiconductor component 20B. Semiconductor component 20B has a CMOS structure, or the like, as with semiconductor component 20 according to Embodiment 1.

3.2 Singhal Flows in Periphery of Variable Phase Circuit 31B

Figure 8A:
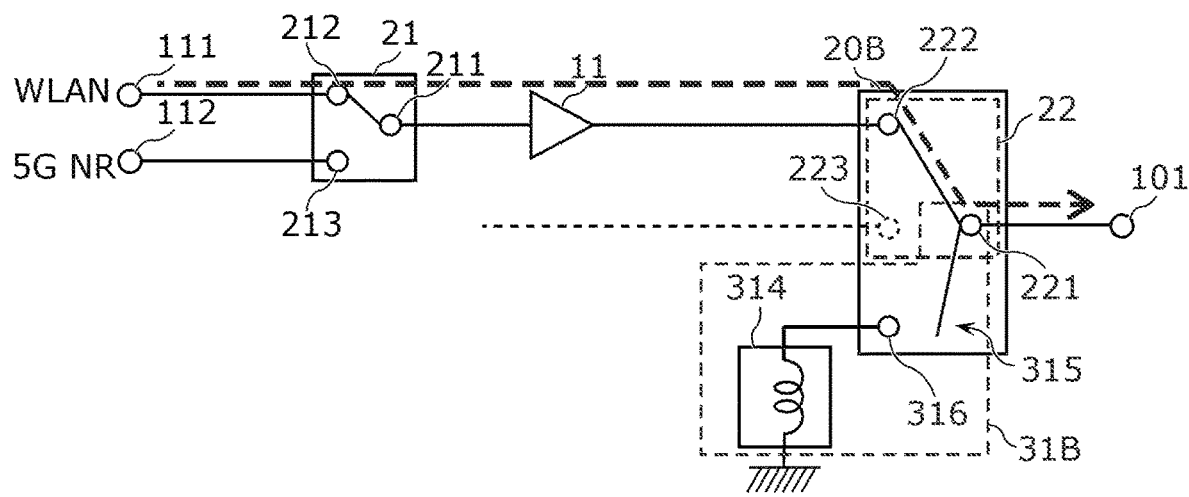
FIG. 8A is a circuit diagram showing a first connection status of the variable phase circuit according to Variation 2.
Figure 8B:
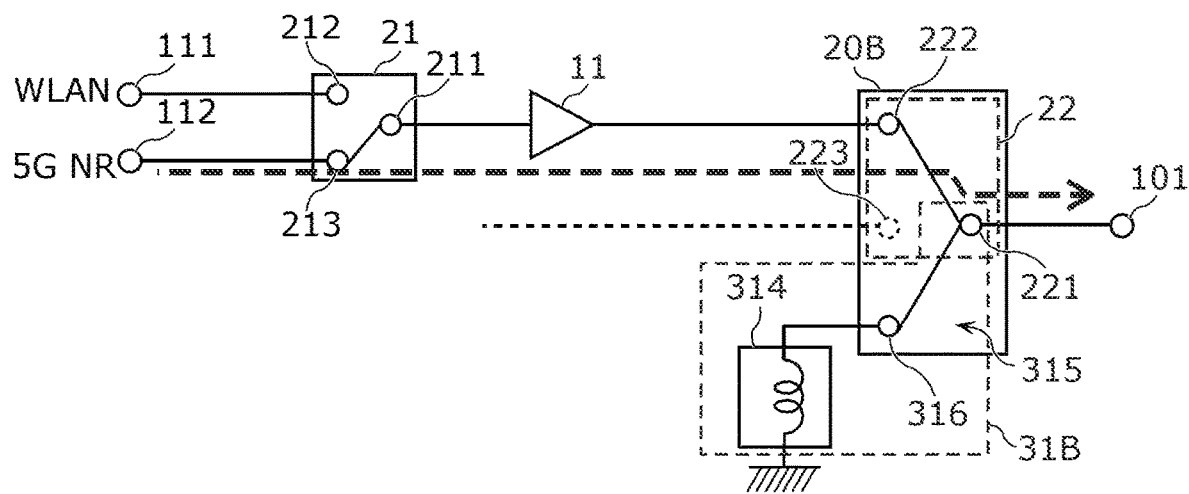
FIG. 8B is a circuit diagram showing a second connection status of the variable phase circuit according to Variation 2.

With reference to FIG. 8A and FIG. 8B, the following describes the signal flows in the periphery of variable phase circuit 31B with the above configuration. FIG. 8A is a circuit diagram showing a first connection status of variable phase circuit 31B according to Variation 2. FIG. 8B is a circuit diagram showing a second connection status of variable phase circuit 31B according to Variation 2. In FIG. 8A and FIG. 8B, the dashed arrows represent the signal flows in the first connection status and the second connection status, respectively.

To enable the first connection status in FIG. 8A and the second connection status in FIG. 8B, the controller of RFIC 3 controls the connections of the switches in radio frequency circuit 1.

More specifically, in FIG. 8A, RFIC 3 causes switch 21 to connect common terminal 211 to first terminal 212, and does not cause switch 315 to connect common terminal 221 to third terminal 316. This enables a WLAN transmission signal to be transferred from RFIC 3 to antenna 2 via first input terminal 111, switch 21, power amplifier 11, switch 22, and antenna connection terminal 101. Here, inductor 314 is not connected to the transmission path of the WLAN transmission signal, and thus the phase of variable phase circuit 31B is set to the first phase.

In FIG. 8B, RFIC 3 causes switch 21 to connect common terminal 211 to second terminal 213, and causes switch 315 to connect common terminal 221 to third terminal 316. This enables a 5GNR transmission signal to be transferred from RFIC 3 to antenna 2 via second input terminal 112, switch 21, power amplifier 11, switch 22, and antenna connection terminal 101. Here, inductor 314 is connected to the transmission path of the 5GNR transmission signal, and thus the phase of variable phase circuit 31B is set to the second phase.

In response to the switching between connecting and disconnecting power amplifier 11 and inductor 314 in the above manner in accordance with a connection status of switch 21, variable phase circuit 31B switches between the first phase and the second phase to change the impedance matching between power amplifier 11 and the load.

As described above, in radio frequency circuit 1 according to the present variation, variable phase circuit 31B may include: a reactance element connected between the ground and a path that couples power amplifier 11 and antenna connection terminal 101; and switch 315 that switches between connecting and disconnecting the reactance element and power amplifier 11 in accordance with a connection status of switch 21.

This configuration enables an easy implementation of variable phase circuit 31B, using switch 315 and an invariable reactance element as a parallel element.

Also, in radio frequency circuit 1 according to the present variation, for example, the reactance element may include inductor 314, and switch 315 may not connect inductor 314 to power amplifier 11 under a condition that switch 21 connects first input terminal 111 and power amplifier 11, and may connect inductor 314 to power amplifier 11 under a condition that switch 21 connects second input terminal 112 and power amplifier 11.

In this configuration, inductor 314 of variable phase circuit 31B is not connected to the transmission path for the transmission of a WLAN transmission signal, which requires a higher signal quality than is required by a 5GNR transmission signal. This configuration is thus capable of reducing the loss caused by inductor 314, thereby reducing the degradation in signal quality caused by variable phase circuit 31B. In particular, the Q-value of an inductor is smaller in many cases than that of a capacitor. As such, the control of switch 315 in the present variation is effective in reducing the degradation in signal quality caused by variable phase circuit 31B.

Also, radio frequency circuit 1 according to the present variation may further include, for example, switch 22 that switches between connecting and disconnecting power amplifier 11 and antenna connection terminal 101. Here, switch 22 and switch 315 may be included in the same semiconductor component.

This configuration reduces the number of components to be mounted on the substrate, thereby achieving the downsizing of radio frequency circuit 1.

Note that variable phase circuit 31B according to the present variation includes inductor 314 as a reactance element, but the present disclosure is not limited to this. Variable phase circuit 31B may thus include a capacitor instead of, or in addition to inductor 314. In this case, the capacitor may be included in semiconductor component 20B. This configuration reduces the number of components to be mounted on the substrate, thereby achieving the downsizing of radio frequency circuit 1.

Note that switch 22 and switch 315 share common terminal 221 in the present variation, but the present disclosure is not limited to this. For example, switch 315 may be connected between the ground and the node that is located between power amplifier 11 and first terminal 222 of switch 22.

Embodiment 2

Next, Embodiment 2 will be described. The present embodiment is different from Embodiment 1 mainly in that at least one matching circuit is connected between power amplifier 11 and switch 22. With reference to the drawings, the following focuses on the difference from Embodiment 1 to describe the present embodiment.

4.1 Circuit Configuration of Radio Frequency Circuit 1A

Figure 9:
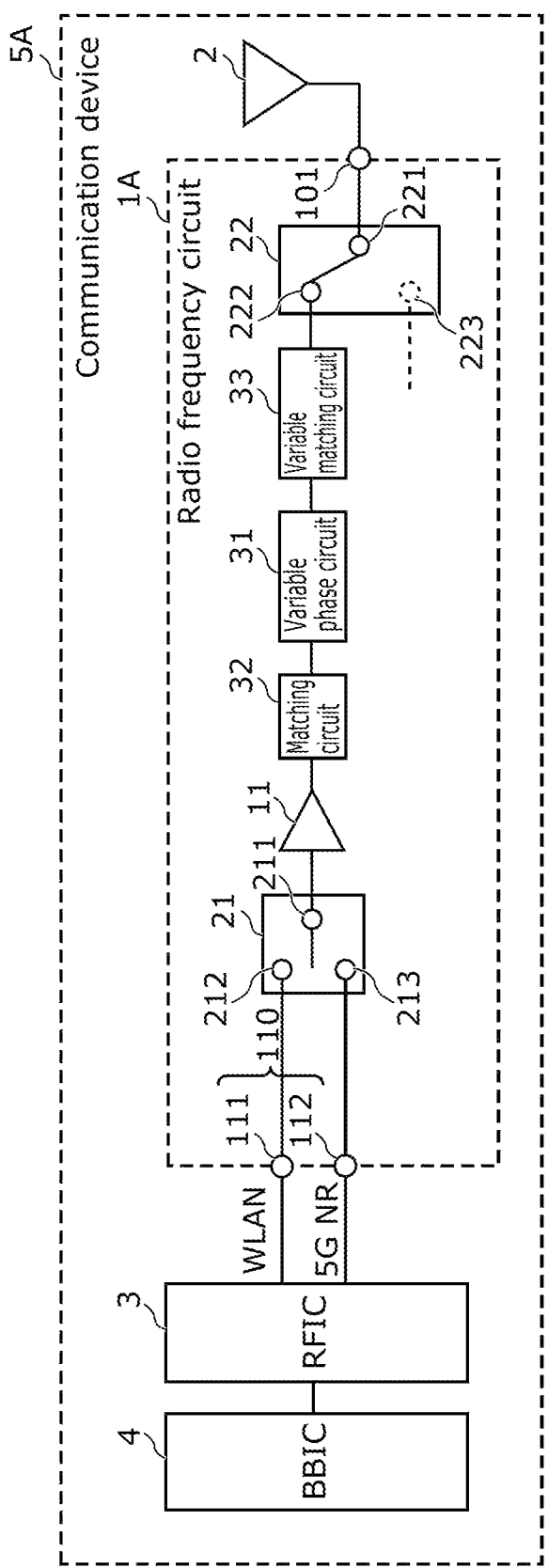
FIG. 9 is a diagram showing the circuit configurations of a radio frequency circuit and a communication device according to Embodiment 2.

FIG. 9 is a diagram showing the circuit configurations of radio frequency circuit 1A and communication device 5A according to Embodiment 2. As shown in FIG. 9, radio frequency circuit 1A according to the present embodiment further includes matching circuit 32 and variable matching circuit 33.

Matching circuit 32, which is an exemplary first matching circuit, is connected between power amplifier 11 and variable phase circuit 31. Matching circuit 32 according to the present embodiment is directly connected to variable phase circuit 31. Matching circuit 32 is implemented, for example, as an inductor and/or a capacitor. Matching circuit 32 matches the output impedance of power amplifier 11 to the input impedance of variable phase circuit 31.

Variable matching circuit 33, which is an exemplary second matching circuit, is a variable impedance matching circuit. Variable matching circuit 33 is connected between variable phase circuit 31 and antenna connection terminal 101. Variable matching circuit 33 is implemented, for example as an inductor and/or a capacitor. Variable matching circuit 33 matches the output impedance of variable phase circuit 31 to the input impedance of antenna connection terminal 101. Note that variable matching circuit 33 may not be capable of varying impedance.

As described above, radio frequency circuit 1A according to the present embodiment may further include matching circuit 32 connected between power amplifier 11 and variable phase circuit 31.

This configuration enables matching circuit 32 to match the output impedance of power amplifier 11 to the input impedance of variable phase circuit 31, thereby improving the electrical characteristics of radio frequency circuit 1A.

Also, in radio frequency circuit 1A according to the present embodiment, matching circuit 32 may be directly connected to variable phase circuit 31.

This configuration enables a more accurate impedance matching of the output impedance of power amplifier 11.

Also, radio frequency circuit 1A according to the present embodiment may further include, for example, variable matching circuit 33 connected between variable phase circuit 31 and antenna connection terminal 101.

This configuration enables to change the output impedance in accordance with the changes in the input impedance of variable phase circuit 31. This configuration is thus capable of matching the output impedance of variable phase circuit 31.

Note that radio frequency circuit 1A according to the present embodiment includes both matching circuit 32 and variable matching circuit 33, but the present disclosure is not limited to this configuration. Radio frequency circuit 1A may thus include, for example, only one of matching circuit 32 and variable matching circuit 33.

Also, a connection among variable phase circuit 31, matching circuit 32, and variable matching circuit 33 is not limited to the relationship shown in FIG. 9.

Embodiment 3

Next, Embodiment 3 will be described. The present embodiment is different from Embodiment 1 mainly in that the radio frequency circuit includes a reception path in addition to the transmission path. With reference to the drawings, the following focuses on the differences from Embodiment 1 to describe the present embodiment.

5.1 Circuit Configuration of Radio Frequency Circuit 1B

Figure 10:
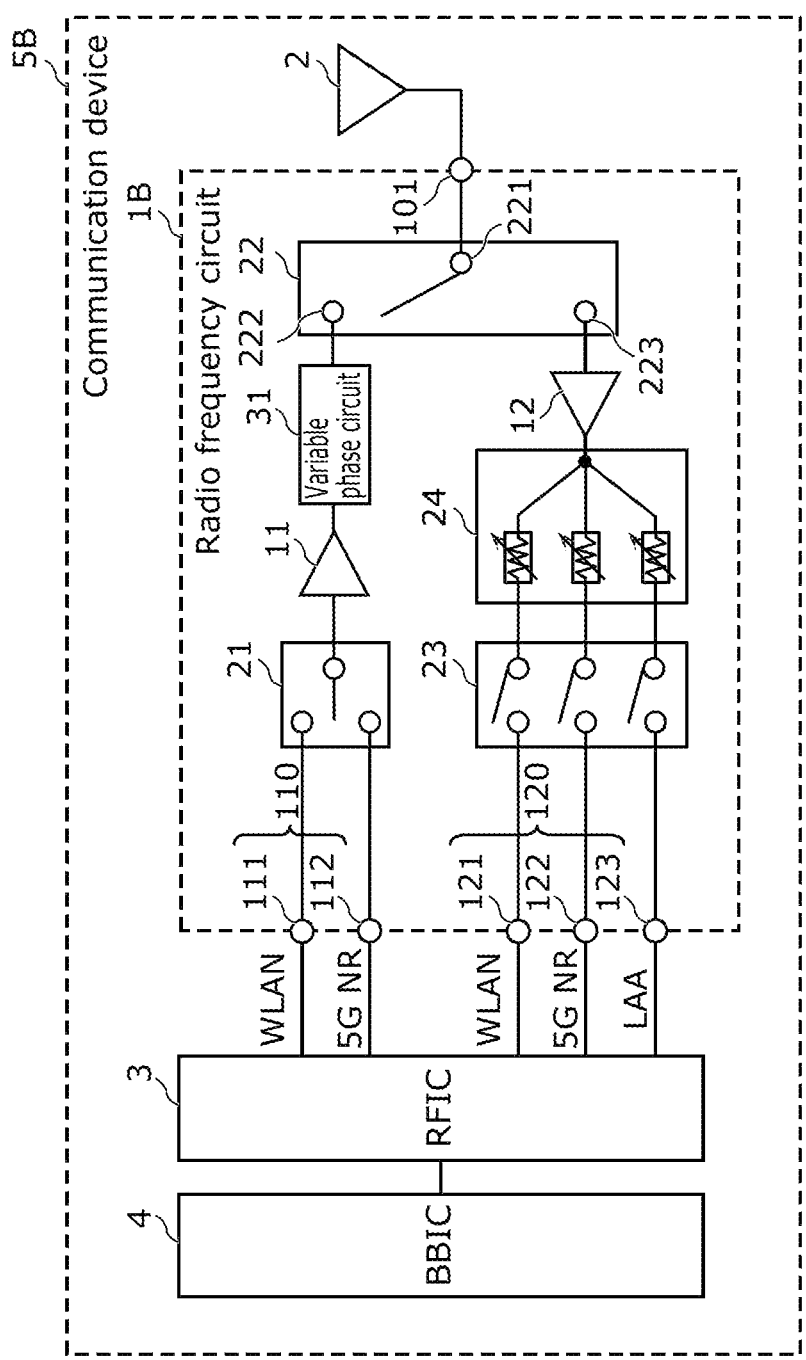
FIG. 10 is a diagram showing the circuit configurations of a radio frequency circuit and a communication device according to Embodiment 3.

FIG. 10 is a diagram showing the circuit configurations of radio frequency circuit 1B and communication device 5B according to Embodiment 3. As shown in FIG. 10, radio frequency circuit 1B according to the present embodiment further includes low-noise amplifier 12, switch 23, distributor 24, and a plurality of output terminals 120 that include first output terminal 121, second output terminal 122, and third output terminal 123.

First output terminal 121 is a terminal through which a WLAN reception signal is supplied to RFIC 3. The WLAN reception signal is a signal received by the client from an access point in compliance with the IEEE 802. 11 standard.

Second output terminal 122 is a terminal through which a 5GNR reception signal is supplied to RFIC 3. The 5GNR reception signal is a downlink signal received by the terminal device from a base station in compliance with 5G NR.

Third output terminal 123 is a terminal through which an LAA signal is supplied to RFIC 3. The LAA signal is a downlink signal received by the terminal device from a base station in compliance with LTE-LAA standardized by 3G PP.

Note that a plurality of output terminals 120 may not include third output terminal 123. Also, a plurality of output terminals 120 may include another output terminal different from first through third output terminals 121 through 123.

Low-noise amplifier 12 is an amplifier capable of amplifying the WLAN reception signal, the 5GNR reception signal, and the LAA signal. A detailed configuration of low-noise amplifier 12 is not limited to a particular configuration.

Second terminal 223 of switch 22 according to the present embodiment is connected to the reception path. More specifically, second terminal 223 is connected to distributor 24.

Switch 23, which is an exemplary fourth switch, is connected to the output side of low-noise amplifier 12 to switch between connecting and disconnecting low-noise amplifier 12 and each of a plurality of output terminals 120.

Distributor 24 is connected between low-noise amplifier 12 and switch 23 to distribute the radio frequency signals output from low-noise amplifier 12 to at least two of a plurality of output terminals 120. Distributor 24 according to the present embodiment distributes the radio frequency signals to first through third output terminals 121 through 123. This enables a single low-noise amplifier 12 to amplify the WLAN reception signal, the 5GNR reception signal, and the LAA signal.

As described above, radio frequency circuit 1B according to the present embodiment may further include low-noise amplifier 12; a plurality of output terminals 120 including first output terminal 121 through which a WLAN reception signal is supplied and second output terminal 122 through which a 5GNR reception signal is supplied; and switch 23 connected between low-noise amplifier 12 and the plurality of output terminals 120 and switches between connecting and disconnecting low-noise amplifier 12 and each of the plurality of output terminals 120.

This configuration enables radio frequency circuit 1B to transmit and receive a WLAN signal and a 5GNR signal.

Also, in radio frequency circuit 1B according to the present embodiment, for example, the plurality of output terminals 120 may further include third output terminal 123 through which an LAA signal used for LTE is supplied.

This configuration further enables radio frequency circuit 1B to receive an LAA signal.

Also, radio frequency circuit 1B according to the present embodiment may further include, for example, distributor 24 connected between low-noise amplifier 12 and switch 23 and distributes, to at least two of the plurality of output terminals 120, radio frequency signals output from low-noise amplifier 12.

This configuration enables the shared use of low-noise amplifier 12 between radio frequency signals corresponding to at least two of a plurality of output terminals 120. This configuration thus reduces the size and the number of components of radio frequency circuit 1B.

Also, in radio frequency circuit 1B according to the present embodiment, for example, at least two of a plurality of output terminals 120 may include first output terminal 121 and second output terminal 122.

This configuration enables the shared use of low-noise amplifier 12 between a WLAN reception signal and a 5GNR reception signal.

Note that radio frequency circuit 1B according to the present embodiment may not include distributor 24.

Embodiment 4

Next, Embodiment 4 will be described. In the foregoing embodiments, the WLAN transmission signal is only a signal (first WLAN signal) that is transferred via power amplifier 11 and variable phase circuit 31 through which a 5GNR transmission signal is also transferred, but a signal (second WLAN signal) that is not transferred through power amplifier 11 and variable phase circuit 31 may be present. To achieve this, the radio frequency circuit according to the present embodiment includes a bypass path through which the second WLAN signal is transferred. With reference to the drawings, the following focuses on the difference from Embodiment 3 to describe the present embodiment.

6.1 Circuit Configuration of Radio Frequency Circuit 1C

Figure 11:
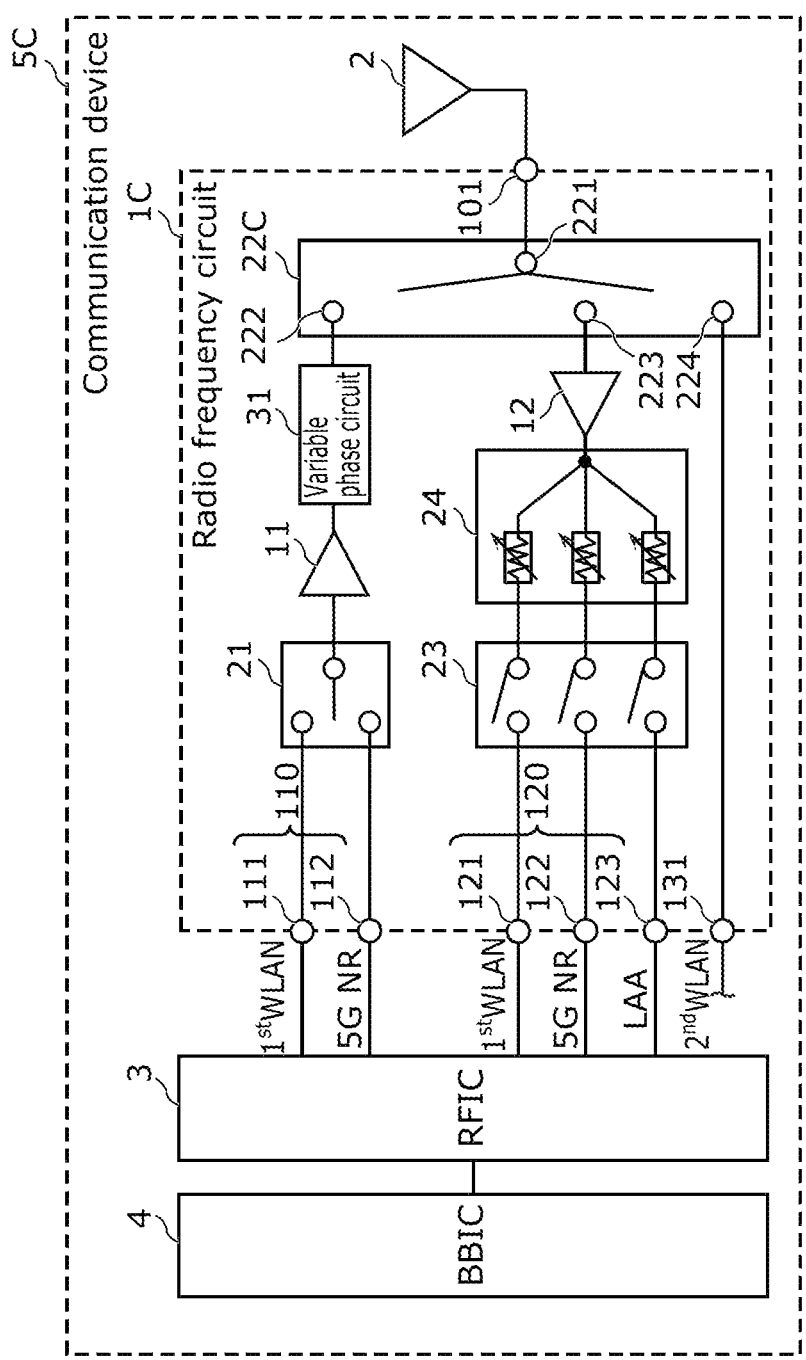
FIG. 11 is a diagram showing the circuit configurations of a radio frequency circuit and a communication device according to Embodiment 4.

FIG. 11 is a diagram showing the circuit configurations of radio frequency circuit 1C and communication device 5C according to Embodiment 4. As shown in FIG. 11, radio frequency circuit 1C according to the present embodiment further includes input-output terminal 131. Radio frequency circuit 1C also includes switch 22C instead of switch 22.

Input-output terminal 131 is a terminal through which a second WLAN reception signal is supplied to another radio frequency circuit (not illustrated) and through which a second WLAN transmission signal is received from another radio frequency circuit. The second WLAN transmission signal is, for example, a signal of a different mode (e.g., transmission power mode) from that of the first WLAN transmission signal received through first input terminal 111. The second WLAN reception signal is, for example, a signal of a different mode from that of the first WLAN reception signal supplied through first output terminal 121. Note that the second WLAN transmission signal and the second WLAN reception signal may be the same as the first WLAN transmission signal and the first WLAN reception signal, respectively.

Note that the other radio frequency circuit may be included in RFIC 3.

Switch 22C includes third terminal 224 connected to input-output terminal 131, in addition to common terminal 221, first terminal 222, and second terminal 223. Having such connection structure, switch 22C connects one of, two of, or all of first terminal 222, second terminal 223, and third terminal 224 to common terminal 221 on the basis of a control signal, for example, from RFIC 3. This enables switch 22C to switch between connecting and disconnecting antenna connection terminal 101 and power amplifier 11, connecting and disconnecting antenna connection terminal 101 and low-noise amplifier 12, and further connecting and disconnecting antenna connection terminal 101 and input-output terminal 131. Switch 22C is implemented, for example, as a multi-connection switch circuit capable of two or more simultaneous connections.

6.2 Singhal Flows in Radio Frequency Circuit 1C and Communication Device 5C

Figure 12A:
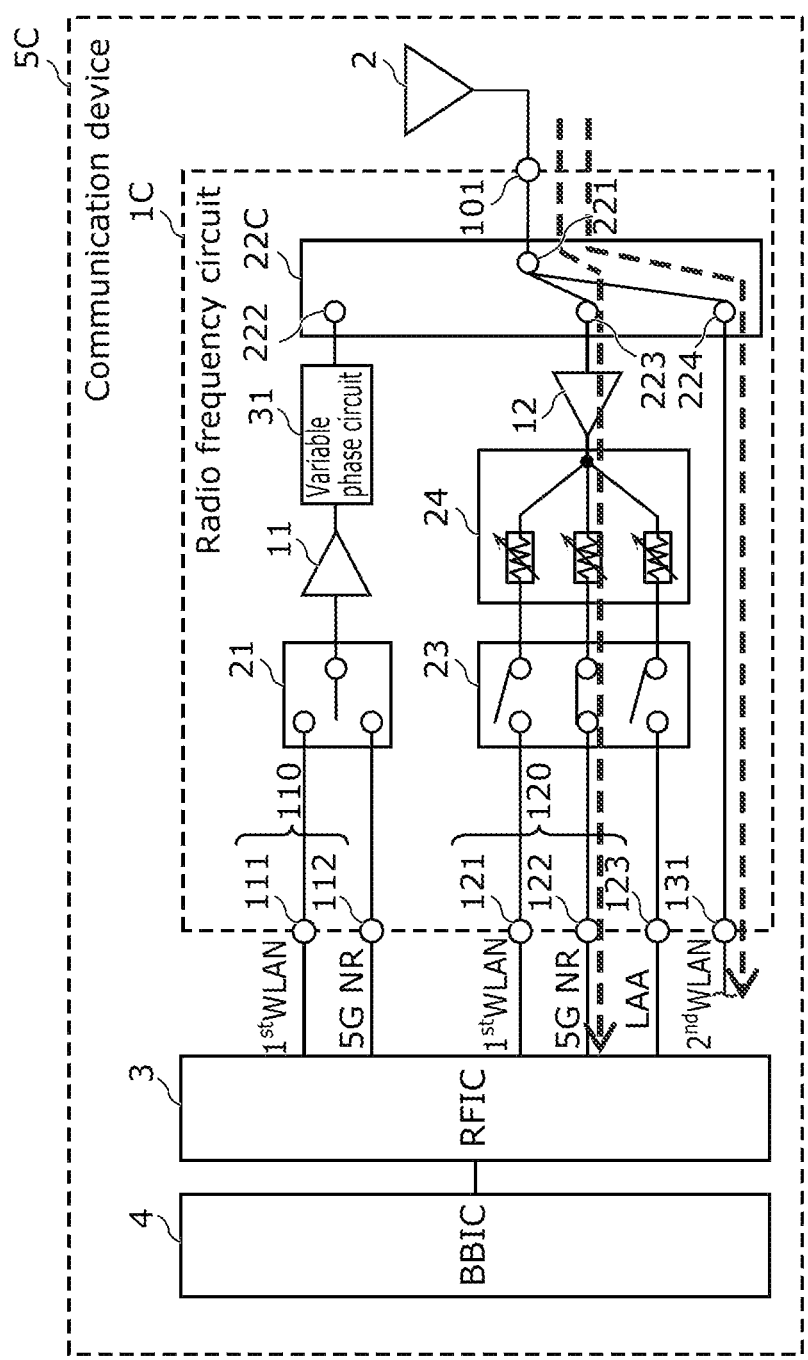
FIG. 12A is a circuit diagram showing a first connection status of the radio frequency circuit according to Embodiment 4.
Figure 12B:
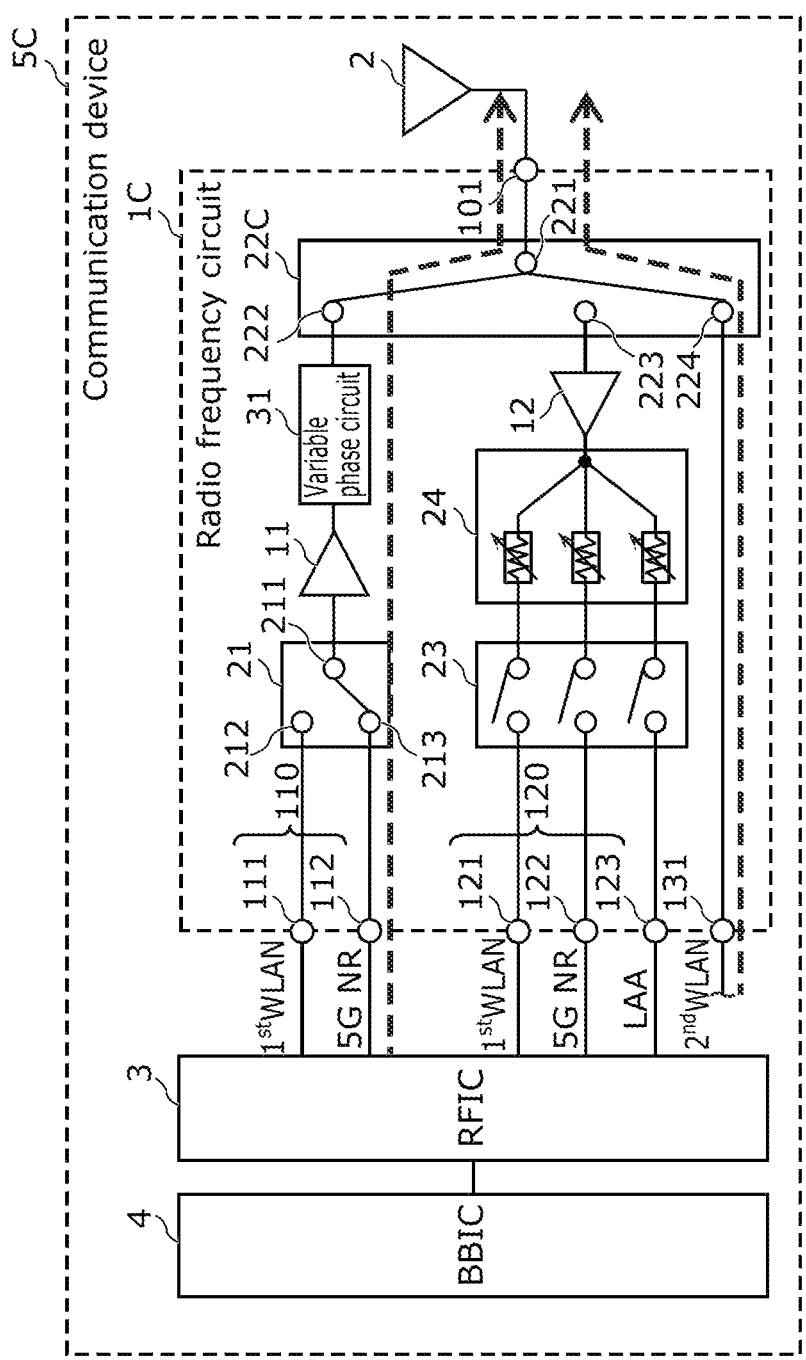
FIG. 12B is a circuit diagram showing a second connection status of the radio frequency circuit according to Embodiment 4.

With reference to FIG. 12A and FIG. 12B, the following describes the signal flows in radio frequency circuit 1C and communication device 5C with the above configurations. FIG. 12A is a circuit diagram showing a first connection status of radio frequency circuit 1C according to Embodiment 4. FIG. 12B is a circuit diagram showing a second connection status of radio frequency circuit 1C according to Embodiment 4. In FIG. 12A and FIG. 12B, the dashed arrows represent the signal flows in the first connection status and the second connection status, respectively.

To enable the first connection status in FIG. 12A and the second connection status in FIG. 12B, the controller of RFIC 3 controls the connections of the switches in radio frequency circuit 1C.

More specifically, in FIG. 12A, RFIC 3 causes switch 22C to connect common terminal 211 to second terminal 223 and third terminal 224, and causes switch 23 to connect to the path leading to second output terminal 122. This enables a 5GNR reception signal to be transferred from antenna 2 to second output terminal 122 via antenna connection terminal 101, switch 22C, low-noise amplifier 12, distributor 24, and switch 23. Also, the second WLAN reception signal is transferred from antenna 2 to another radio frequency circuit via antenna connection terminal 101, switch 22C, and input-output terminal 131.

In FIG. 12B, RFIC 3 causes switch 21 to connect common terminal 211 to second terminal 223, and causes switch 22C to connect common terminal 221 to first terminal 222 and third terminal 224. Thorough this, the phase of variable phase circuit 31 is set to the second phase, and a 5GNR transmission signal is transferred from RFIC 3 to antenna 2 via second input terminal 112, switch 21, power amplifier 11, switch 22C, and antenna connection terminal 101. Also, the second WLAN transmission signal is transferred from another radio frequency circuit to antenna 2 via input-output terminal 131, switch 22C, and antenna connection terminal 101.

As described above, the use of a bypass path that connects antenna connection terminal 101 to another radio frequency circuit enables communication device 5C to achieve simultaneous transmission and simultaneous reception of a second WLAN signal and a 5GNR signal.

Note that in the case where the 5GNR transmission signal and the second WLAN transmission signal are not simultaneously transmitted, the second WLAN transmission signal may be transmitted via power amplifier 11 and variable phase circuit 31. In this case, the phase of variable phase circuit 31 may be switched to a phase (e.g., first phase) for achieving an impedance matching appropriate for power amplifier 11 to amplify the second WLAN transmission signal.

Also, in the case where the 5GNR transmission signal and the second WLAN transmission signal are not simultaneously transmitted, variable phase circuit 31 may be used for the impedance matching between another radio frequency circuit and the load. More specifically, in the case where the second WLAN transmission signal is transmitted via the bypass path that couples input-output terminal 131 and antenna connection terminal 101, and the 5GNR transmission signal is not transmitted, variable phase circuit 31 may be connected, for example, between the ground and such bypass path (common terminal 221 in the present embodiment) via switch 22C, and may be set to a phase (e.g., first phase) for achieving an impedance matching appropriate for power amplifier 11 to amplify the second WLAN transmission signal. Stated differently, variable phase circuit 31 may change the impedance matching between another radio frequency circuit and the load in accordance with a connection status of switch 22C.

As described above, radio frequency circuit 1C according to the present embodiment may further include input-output terminal 131 through which a second WLAN transmission signal is received from another radio frequency circuit and through which a second WLAN reception signal is supplied to the other radio frequency circuit. In this radio frequency circuit 1C, switch 22 may further switch between connecting and disconnecting antenna connection terminal 101 and input-output terminal 131.

This configuration, which enables another radio frequency circuit to amplify the second WLAN signal, achieves simultaneous transmission and simultaneous reception of the second WLAN signal and the 5 GNR signal.

Also, in radio frequency circuit 1C according to the present embodiment, variable phase circuit 31 may be further connected between the ground and a path that couples input-output terminal 131 and antenna connection terminal 101 and may change the impedance matching between the other radio frequency circuit and the load in accordance with a connection status of switch 22C.

This configuration enables the use of variable phase circuit 31 also to change the impedance matching between another radio frequency circuit and the load.

Another Embodiment

The radio frequency circuit and the communication device according to the present disclosure have been described above, using the embodiments and variations thereof, but the radio frequency circuit and the communication device according to the present disclosure are not limited to such embodiments and variations thereof. The present disclosure also includes: another embodiment achieved by freely combining structural elements in the foregoing embodiments and variations thereof; variations achieved by making various modifications to the foregoing embodiments and variations thereof that can be conceived by those skilled in the art without departing from the essence of the present disclosure; and various devices that include the radio frequency circuit and the communication device described above.

For example, in the radio frequency circuit and the communication device according to the foregoing embodiments and variations thereof, another circuit element, wiring, and so forth may be interposed in a path that connects each circuit element and a signal path disclosed in the drawings. In the foregoing embodiments and variations thereof, for example, a filter may be interposed at the output side of power amplifier 11. In FIG. 1, for example, such filter may be connected between variable phase circuit 31 and first terminal 222 of switch 22. This configuration prohibits the entry of an unnecessary signal to variable phase circuit 31 from second terminal 223, thus facilitating the achievement of a desired impedance matching between power amplifier 11 and the load. Alternatively, for example, the filter may be connected between common terminal 221 of switch 22 and antenna connection terminal 101. This configuration facilitates the connection of variable phase circuit 31 and switch 22, thereby achieving an easy encapsulation of variable phase circuit 31 and switch 22 into a single chip.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The present disclosure is widely applicable for use in a communication device (e.g., a mobile phone) as a radio frequency circuit that is placed at the front-end portion.

The invention claimed is:

1. A radio frequency circuit, comprising:
    a plurality of input terminals including a first input terminal through which a first Wireless Local Area Network (WLAN) transmission signal is received and a second input terminal through which a 5th Generation New Radio (5G NR) transmission signal is received;
    a power amplifier;
    a first switch connected to an input side of the power amplifier and configured to switch a connection of the power amplifier between the plurality of input terminals; and
    a variable phase circuit connected to an output side of the power amplifier and configured to set a first output impedance of the power amplifier when the first input terminal is connected to the power amplifier through the first switch, and set a second output impedance of the power amplifier when the second input terminal is connected to the power amplifier through the first switch, wherein the first output impedance and the second output impedance are different from each other.

2. The radio frequency circuit according to claim 1, wherein the variable phase circuit includes a variable capacitor.

3. The radio frequency circuit according to claim 2, further comprising:
    an antenna switch configured to switch between connecting and disconnecting the power amplifier and an antenna connection terminal,
    wherein the variable capacitor and the antenna switch are included in a same semiconductor component.

4. The radio frequency circuit according to claim 1,
wherein the variable phase circuit includes:
a second switch configured to switch between a first path coupling the power amplifier and an antenna connection terminal and a second path coupling the power amplifier and the antenna connection terminal in accordance with a connection status of the first switch; and
a reactance element connected to the second path and not connected to the first path.

5. The radio frequency circuit according to claim 4,
wherein the second switch is configured to select
the first path under a condition that the first switch connects the first input terminal and the power amplifier, and
the second path under a condition that the first switch connects the second input terminal and the power amplifier.

6. The radio frequency circuit according to claim 4,
wherein the reactance element includes a capacitor, and the capacitor and the second switch are included in a same semiconductor component.

7. The radio frequency circuit according to claim 1,
wherein the variable phase circuit includes:
a reactance element connected between a ground and a path that couples the power amplifier and an antenna connection terminal; and
a third switch configured to switch between connecting and disconnecting the reactance element and the power amplifier in accordance with the connection status of the first switch.

8. The radio frequency circuit according to claim 7,
further comprising:
an antenna switch configured to switch between connecting and disconnecting the power amplifier and an antenna connection terminal,
wherein the antenna switch and the third switch are included in a same semiconductor component.

9. The radio frequency circuit according to claim 8,
wherein the reactance element includes a capacitor, and
the capacitor is included in the same semiconductor component in which the antenna switch and the third switch are included.

10. The radio frequency circuit according to claim 1, further comprising:
a first matching circuit connected between the power amplifier and the variable phase circuit.

11. The radio frequency circuit according to claim 10,
wherein the first matching circuit is directly connected to the variable phase circuit.

12. The radio frequency circuit according to claim 10, further comprising:
a second matching circuit connected between the variable phase circuit and an antenna connection terminal.

13. The radio frequency circuit according to claim 1, further comprising:
a low-noise amplifier;
a plurality of output terminals including a first output terminal through which a first WLAN reception signal is supplied and a second output terminal through which a 5GNR reception signal is supplied; and
a fourth switch connected between the low-noise amplifier and the plurality of output terminals and configured to switch between connecting and disconnecting the low-noise amplifier and each of the plurality of output terminals.

14. The radio frequency circuit according to claim 13,
wherein the plurality of output terminals further include a third output terminal through which a Licensed-Assisted Access (LAA) signal used for Long Term Evolution (LTE) is supplied.

15. The radio frequency circuit according to claim 13, further comprising:
a distributor connected between the low-noise amplifier and the fourth switch and configured to distribute, to at least two of the plurality of output terminals, radio frequency signals output from the low-noise amplifier.

16. The radio frequency circuit according to claim 13, further comprising:
an input-output terminal through which a second WLAN transmission signal is received from another radio frequency circuit and through which a second WLAN reception signal is supplied to the other radio frequency circuit; and
an antenna switch configured to switch between connecting and disconnecting an antenna connection terminal and the power amplifier, switch between connecting and disconnecting the antenna connection terminal and the low-noise amplifier, and switch between connecting and disconnecting the antenna connection terminal and the input-output terminal.

17. The radio frequency circuit according to claim 16,
wherein the variable phase circuit is further connected between a ground and a path that couples the input-output terminal and the antenna connection terminal and configured to change an impedance matching between the other radio frequency circuit and a load in accordance with a connection status of the antenna switch.

18. The radio frequency circuit according to claim 1,
wherein a frequency band of the first WLAN transmission signal is one of 5.15-5.35 GHz, 5.47-5.85 GHz, or 5.925-7.125 GHz, and
a frequency band of the 5GNR transmission signal is one of n46 ranging from 5.15 GHz to 5.925 GHz or n96 ranging from 5.925 GHz to 7.125 GHz.

19. A communication device, comprising:
a signal processing circuit configured to process a radio frequency signal; and
the radio frequency circuit according to claim 1 configured to transfer the radio frequency signal between the signal processing circuit and an antenna.

20. A radio frequency circuit, comprising:
a plurality of input terminals including a first input terminal through which a first Wireless Local Area Network (WLAN) transmission signal is received and a second input terminal through which a 5th Generation New Radio (5G NR) transmission signal is received;
a power amplifier;
a first switch connected to an input side of the power amplifier and configured to switch a connection of the power amplifier between the plurality of input terminals; and
a variable phase circuit connected to an output side of the power amplifier and configured to change an impedance matching between the power amplifier and a load in accordance with a connection status of the first switch,
wherein the variable phase circuit includes:
a reactance element connected between a ground and a path that couples the power amplifier and an antenna connection terminal; and a third switch configured to switch between connecting and disconnecting the reactance element and the power amplifier in accordance with the connection status of the first switch,
the reactance element includes an inductor, and
the third switch is configured to
not connect the inductor to the power amplifier under a condition that the first switch connects the first input terminal and the power amplifier, and
connect the inductor to the power amplifier under a condition that the first switch connects the second input terminal and the power amplifier.

21. A radio frequency circuit, comprising:
a plurality of input terminals including a first input terminal through which a first Wireless Local Area Network (WLAN) transmission signal is received and a second input terminal through which a 5th Generation New Radio (5G NR) transmission signal is received;
a power amplifier;
a first switch connected to an input side of the power amplifier and configured to switch a connection of the power amplifier between the plurality of input terminals; and
a variable phase circuit connected to an output side of the power amplifier and configured to change an impedance matching between the power amplifier and a load in accordance with a connection status of the first switch,
a second switch configured to switch between a first path coupling the power amplifier and an antenna connection terminal and a second path coupling the power amplifier and the antenna connection terminal in accordance with a connection status of the first switch; and
a reactance element connected to the second path and not connected to the first path.

* * * * *